(12) United States Patent
Sarma

(10) Patent No.: US 9,435,824 B2
(45) Date of Patent: Sep. 6, 2016

(54) CIRCUIT TO EXTEND FREQUENCY RESPONSE OF ACCELEROMETER

(71) Applicant: Garimella R Sarma, Newport News, VA (US)

(72) Inventor: Garimella R Sarma, Newport News, VA (US)

(*) Notice: Subject to any disclaimer, the term of this patent is extended or adjusted under 35 U.S.C. 154(b) by 426 days.

(21) Appl. No.: 14/227,192

(22) Filed: Mar. 27, 2014

(65) Prior Publication Data

US 2015/0027199 A1    Jan. 29, 2015

Related U.S. Application Data

(60) Provisional application No. 61/858,439, filed on Jul. 25, 2013.

(51) Int. Cl.
| | |
|---|---|
| *G01P 21/00* | (2006.01) |
| *G01P 15/08* | (2006.01) |
| *H03F 3/52* | (2006.01) |

(52) U.S. Cl.
CPC ............... *G01P 21/00* (2013.01); *G01P 15/08* (2013.01); *H03F 3/52* (2013.01)

(58) Field of Classification Search
CPC ........... G01P 15/00; G01P 15/08; H03F 3/52

USPC .............. 73/514.35; 330/107, 109
See application file for complete search history.

(56) References Cited

U.S. PATENT DOCUMENTS

| 4,292,473 | A | * | 9/1981 | Venken | .............. | H04Q 1/38 |
| | | | | | | 379/382 |
| 5,074,147 | A | * | 12/1991 | Sarma | .............. | G01F 1/696 |
| | | | | | | 73/204.15 |
| 5,663,847 | A | * | 9/1997 | Abramovitch | .......... | G01P 15/08 |
| | | | | | | 360/75 |
| 8,314,585 | B2 | * | 11/2012 | Baker | .............. | G05B 5/01 |
| | | | | | | 188/378 |
| 2005/0253600 | A1 | * | 11/2005 | Sarma | .............. | G01D 3/021 |
| | | | | | | 324/691 |
| 2014/0240156 | A1 | * | 8/2014 | Ismail | .............. | G06F 3/0346 |
| | | | | | | 341/143 |

* cited by examiner

*Primary Examiner* — Herzon E Williams
*Assistant Examiner* — David Z Huang
(74) *Attorney, Agent, or Firm* — Peter J. Van Bergen

(57) ABSTRACT

A compensation circuit connected to an accelerometer's output extends the frequency response of the accelerometer, while reducing noise produced by the accelerometer. The compensation circuit has a gain as a function of frequency that is (i) constant up to a first frequency that is less than the accelerometer's natural resonance frequency, and (ii) reduced to approximately zero at a second frequency that is greater than the accelerometer's natural resonance frequency.

2 Claims, 3 Drawing Sheets

CIRCUIT TO EXTEND FREQUENCY RESPONSE OF ACCELEROMETER

Pursuant to 35 U.S.C. §119, the benefit of priority from provisional application 61/858,439, with a filing date of Jul. 25, 2013, is claimed for this non-provisional application.

FIELD OF THE INVENTION

The invention relates generally to circuits, and more particularly to a circuit that, when connected to the output of an accelerometer, extends the flat frequency response of the accelerometer.

BACKGROUND OF THE INVENTION

The frequency response of an accelerometer is degraded by noise as frequency increases. The general frequency response of an accelerometer is shown in FIG. 1 and is illustrated by the curve referenced by numeral 100. Frequency response 100 is a plot of amplitude ratio (i.e., output of the accelerometer over input to the accelerometer) as a function of frequency. Frequency response 100 is fairly constant up to a frequency $f_1$. At this point, the resonance characteristics of the accelerometer begin to increase the accelerometer's output amplitude (as evidenced by curve region 100A) even when the accelerometer's input remains constant. As a result, the resonance characteristics of an accelerometer produce increased error in region 100A as frequency increases up to the accelerometer's natural resonance frequency $f_{NR}$. Since an accelerometer's resonance characteristics tend to dominate its frequency response, accelerometers are generally only useful up to the frequency (i.e., $f_1$) that can provide a constant ratio within a certain specified error of the output to the input.

SUMMARY OF THE INVENTION

Accordingly, it is an object of the present invention to provide a system for extending the useful frequency response of an accelerometer.

Another object of the present invention is to provide a compensation circuit that, when connected to the output of an accelerometer, extends the flat/constant frequency response within a specified range of error of the accelerometer.

Other objects and advantages of the present invention will become more obvious hereinafter in the specification and drawings.

In accordance with the present invention, a system is provided that extends the frequency response of an accelerometer, while reducing noise produced by the accelerometer. The system includes a compensation circuit connected to the accelerometer's output. The compensation circuit has a gain as a function of frequency that is (i) constant up to a first frequency wherein the first frequency is less than the accelerometer's natural resonance frequency, and (ii) reduced to approximately zero at a second frequency wherein the second frequency is greater than the accelerometer's natural resonance frequency.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
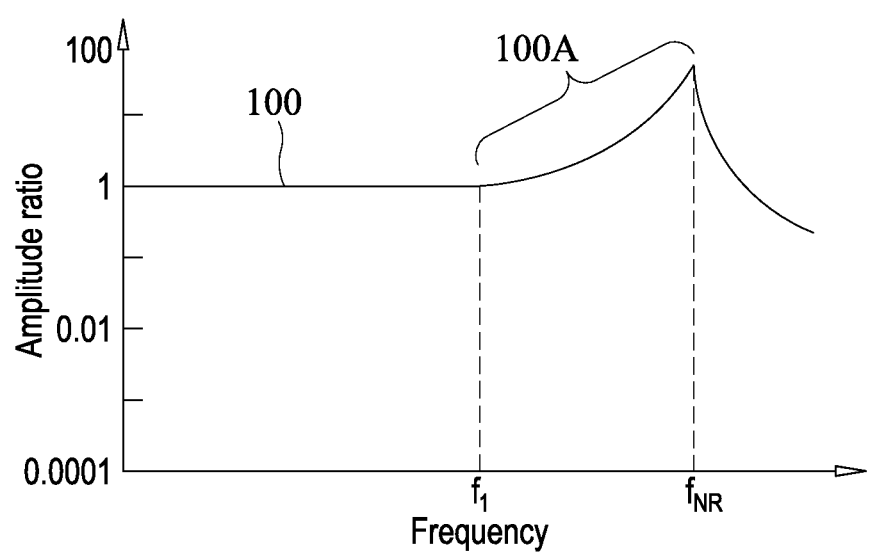
FIG. 1 is a frequency response curve of a conventional and uncompensated accelerometer.
Figure 2:
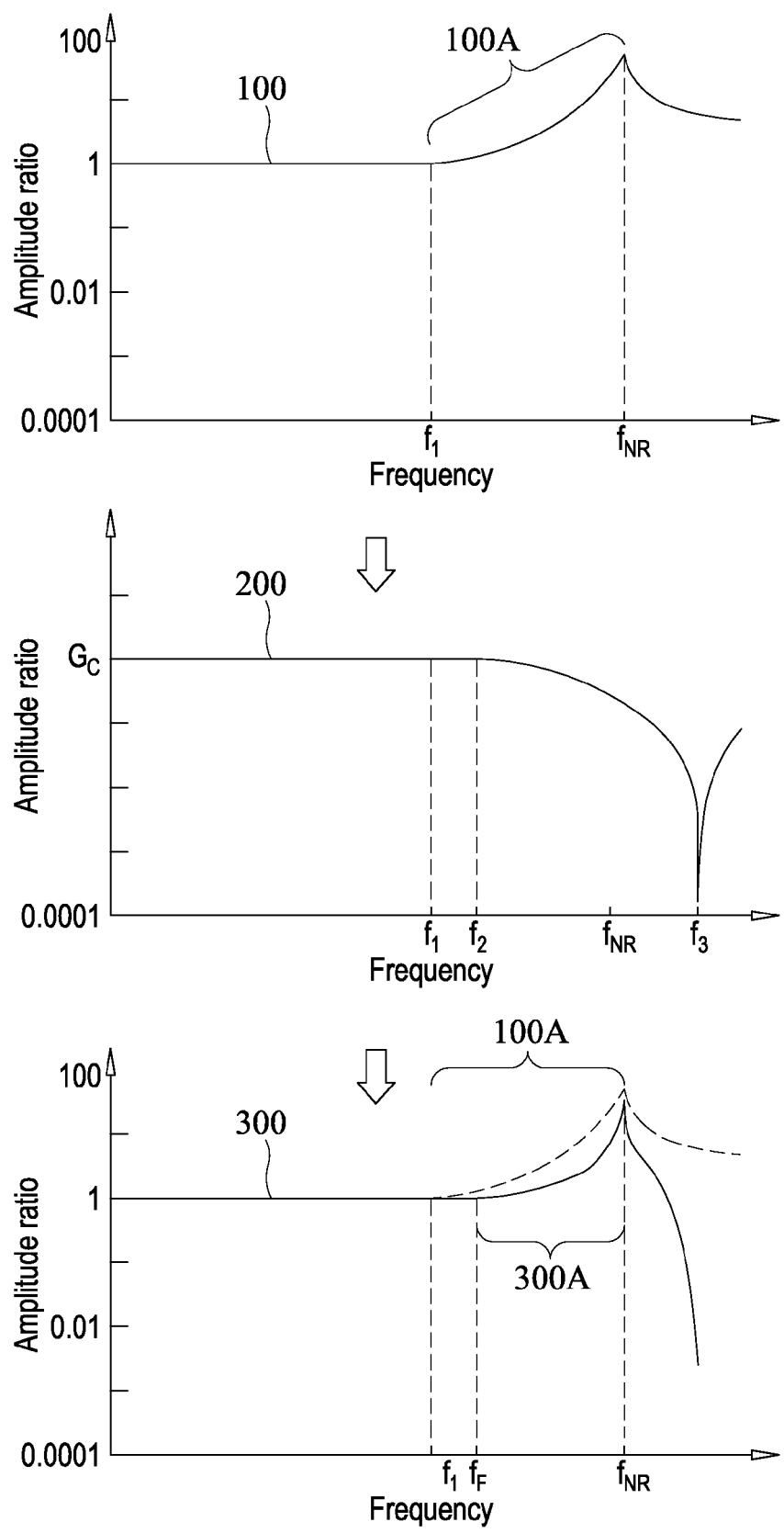
FIG. 2 is a graphic depiction of accelerometer frequency response compensation provided by a compensation circuit in accordance with the present invention.

Referring again to the drawings and more particularly to FIG. 2, a graphic depiction of the process of extending the frequency response of an accelerometer in accordance with the present invention is illustrated. The frequency response of an uncompensated accelerometer is again represented by frequency response curve 100. The frequency response of a compensation circuit (or "compensator" as it will also be referred to herein) in accordance with an embodiment of the present invention is represented by a compensator frequency response curve 200. When compensator frequency response 200 is applied to frequency response 100, a resulting compensated frequency response is depicted by frequency response curve 300. To clearly illustrate the improvements provided by the present invention, the above-described increased error region 100A of uncompensated frequency response curve 100 is plotted using dashed lines along with a solid-line compensated frequency response curve 300.

As mentioned above, the uncompensated frequency response 100 generally has a flat response (e.g., a gain of unity) up to frequency $f_1$. At this point, the accelerometer's resonance characteristics contribution to output becomes prominent to sharply increase the output in region 100A until it peaks at the accelerometer's natural resonance frequency $f_{NR}$. Compensator frequency response 200 provides a constant gain "$G_C$" (e.g., unity) up to a frequency $f_2$ that is greater than the "flat response" frequency $f_1$ associated with uncompensated frequency response 100. After frequency $f_2$, compensator frequency response 200 rolls off sharply to a gain of nearly or approximately zero at a frequency $f_3$ that is greater than both frequency $f_2$ and the accelerometer's natural resonance frequency $f_{NR}$.

When compensator frequency response 200 is applied to uncompensated frequency response 100, two advantageous results are achieved as evidenced by compensated frequency response 300. First, the flat frequency response of the accelerometer is extended to a frequency $f_F$ that is greater than the flat response frequency $f_1$ associated with uncompensated frequency response 100. Second, the noise region 300A of compensated frequency response 300 is significantly reduced (in terms of amplitude ratio) as compared to the noise region 100A of uncompensated frequency response 100.

Figure 3:
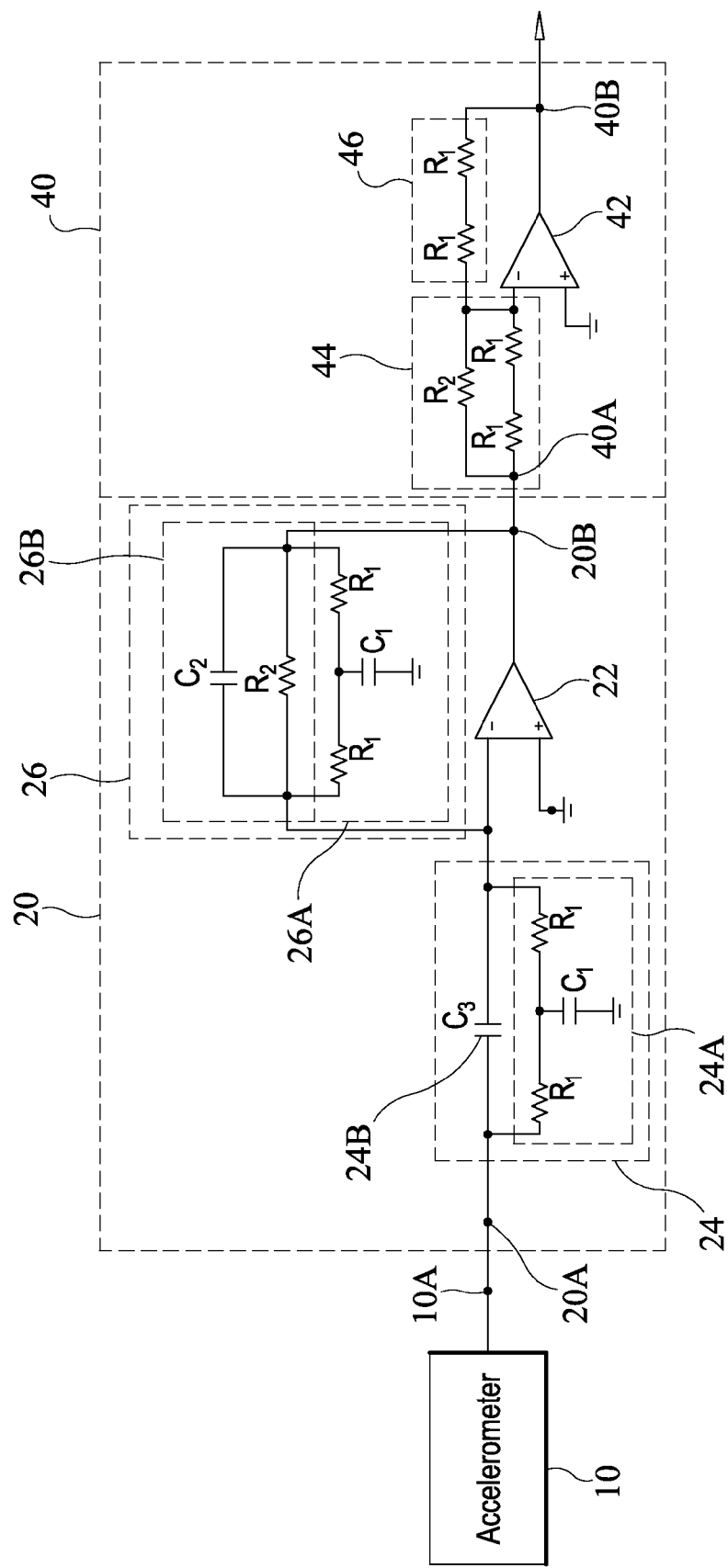
FIG. 3 is a circuit schematic of a compensation circuit and gain scaling circuit connected to an accelerometer that extends the frequency response of the accelerometer while keeping the calibration of the accelerometer valid even in the extended frequency response in accordance with an embodiment of the present invention.

The above improvements provided by compensated frequency response 300 can be provided by a variety of circuit designs without departing from the scope of the present invention. By way of example, one such circuit design will be described and is shown in FIG. 3. An accelerometer 10 having its output 10A is connected to the input 20A of a compensation circuit 20 whose frequency response is of the form described above for compensation frequency response 200. In cases where the gain of compensation circuit 20 reduces the output of accelerometer 10, it may be desirable to connect a gain scaling circuit 40 to the output 20B of compensation circuit 20. As will be explained further below, gain scaling circuit 40 provides for the retention of the calibrated output of accelerometer 10 (in its uncompensated state) even after the compensation provided by compensation circuit 20.

Compensation circuit 20 includes a conventional operational amplifier ("opamp") 22, an input circuit 24 connecting output 10A to the inverting input of opamp 22, and a feedback circuit 26 connecting the inverting input of opamp 22 to the output of opamp 22 that is also the output 20B of compensation circuit 20. The non-inverting input of opamp 22 is connected to ground potential. Input circuit 24 includes a T-network 24A in parallel with a capacitor 24B. In the illustrated embodiment, T-network 24A has two resistors $R_1$ having the same resistance value and a capacitor $C_1$ connected therebetween and to ground potential. Feedback circuit 26 includes a T-network 26A in parallel with a parallel resistance-capacitance (RC) circuit 26B. In the illustrated embodiment, T-network 26A has two resistors $R_1$ having the same resistance values as those used in T-network 24A, and a capacitor $C_1$ connected therebetween and to ground potential where the value of $C_1$ in T-network 26A is the same as capacitor $C_1$ in T-network 24A. It is to be understood that T-networks 24A and 26A are not limited to use with common value resistances and capacitances, although this simplifies analysis for the design of gain scaling circuit 40.

The illustrated embodiment of compensation circuit 20 has a transfer function that is a ratio of two second order polynomials that produces an approximately zero gain "notch" at a frequency (i.e., $f_3$ of compensator frequency response 200) that extends the accelerometer's flat frequency response while also reducing the noise content of the accelerometer's output. Derivation of the transfer function "$T_{cf}$" of compensation circuit 20 will be explained briefly below.

The RC network impedance $Z_f$ of the feedback network defined between output terminal 20B and the inverting input of opamp 22 can be written as $$Z_f = A\left[\frac{T_3 s + 1}{T_1 T_2 s^2 + T_1 s + 1}\right]$$

where, $$A = \frac{2R_1 R_2}{(2R_1 + R_2)}$$

$$T_1 = \frac{R_1(R_1 C_1 + 2R_2 C_2)}{2R_1 + R_2}$$

$$T_2 = \frac{R_1 R_2 C_1 C_2}{R_1 C_1 + 2R_2 C_2}$$

and $$T_3 = \frac{R_1 C_1}{2}$$

The RC network impedance $Z_i$ on the input side of compensation circuit 20 can be written as $$Z_i = B\frac{T_5 s + 1}{T_4 T_5 s^2 + T_4 s + 1}$$

where $$B = 2R_1$$

$$T_4 = 2R_1 C_3$$

and $$T_5 = \frac{R_1 C_1}{2}$$

For the illustrated embodiment, $T_3 = T_5$ so that the transfer function $T_{cf}$ of compensation circuit 20 is $$T_{cf} = \frac{A}{B}\frac{T_4 T_5 s^2 + T_4 s + 1}{T_1 T_2 s^2 + T_1 s + 1}$$

where "s" is the Laplace operator. The transfer function $T_{cf}$ contains only constants derived from the resistances and capacitances in the compensation circuit. Since the coefficient (A/B) will be less than unity in this particular design, a gain scaling circuit is used to retain the accelerometer calibration.

As mentioned above, it can be desirable or necessary to provide gain scaling circuit 40 in order to retain the calibration associated with accelerometer 10. In the illustrated embodiment, a simple gain scaling circuit 40 for use in combination with the illustrated compensation circuit 20 is presented. An input 40A of gain scaling circuit 40 is connected to the output 20B of compensation circuit 20. Gain scaling circuit 40 includes a conventional opamp 42, an input resistance circuit 44 connecting output 20B of compensation circuit 20 (through input 40A) to the inverting input of opamp 42, and a feedback resistance circuit 46 connecting the inverting input of opamp 42 to the output of opamp 42 that is also the output 40B of gain scaling circuit 40. The non-inverting input of opamp 42 is connected to ground potential.

To achieve gain scaling, the net resistance of input resistance circuit 44 should be equivalent to the net resistance of T-network 26A. For example, input resistance circuit 44 can be realized by two resistors of resistance value $R_1$ in series with one another that are connected in parallel with a resistor of resistance value of $R_2$. In addition, the net resistance of feedback resistance circuit 46 should be equivalent to the net resistance of T-network 24A. For example, feedback resistance circuit 46 can be realized by two resistors of resistance value $R_1$ connected in series.

The advantages of the present invention are numerous. The flat frequency response of an accelerometer is extended while accelerometer noise is simultaneously reduced by the present invention's compensation circuit. The addition of a gain scaling circuit can be used to retain the accelerometer's calibration.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A system for extending the frequency response of an accelerometer while reducing noise produced by the accelerometer, comprising a compensation circuit including a first T-network in parallel with a first capacitor, said first T-network defined by two common-value resistors and a capacitor connected therebetween and to ground, an operational amplifier having a non-inverting input coupled to ground, an inverting input, and an output, and a second T-network in parallel with a parallel resistance-capacitance (RC) circuit, wherein said second T-network is identical to said first T-network, and wherein said parallel RC circuit is defined by a second capacitor in parallel with a first resistor, wherein said first T-network is connected between the accelerometer's output and said inverting input of said operational amplifier, and wherein said second T-network in parallel with said parallel RC circuit is connected to said inverting input of said operational amplifier and said output of said operational amplifier.

2. A system as in claim 1, further comprising a scaling circuit connected to said compensation circuit, said scaling circuit including a second operational amplifier having a non-inverting input coupled to ground, an inverting input, and an output, an input resistance circuit connected between said output of said operational amplifier and said inverting input of said second operational amplifier, and a feedback resistance circuit connected between said inverting input of said second operational amplifier and said output of said second operational amplifier, wherein said input resistance circuit has a net resistance equivalent to a net resistance of said second T-network in parallel with said parallel RC circuit, and wherein said feedback resistance circuit has a net resistance equivalent to a net resistance of said first T-network.

* * * * *